(12) United States Patent
Kumar (10) Patent No.: US 7,224,227 B1
(45) Date of Patent: May 29, 2007

(54) APPARATUS AND METHOD FOR CORRECTION OF ERROR CAUSED BY REVERSE SATURATION CURRENT MISMATCH

(75) Inventor: Ajay Kumar, Fort Collins, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 183 days.

(21) Appl. No.: 11/035,156

(22) Filed: Jan. 12, 2005

(51) Int. Cl.
*H03F 3/45* (2006.01)

(52) U.S. Cl. .................. 330/255; 330/263; 330/267

(58) Field of Classification Search ............... None
See application file for complete search history.

(56) References Cited

U.S. PATENT DOCUMENTS 5,323,122 A * 6/1994 Bowers .................. 330/263
5,578,967 A * 11/1996 Harvey .................. 330/263
6,160,451 A * 12/2000 Floru .................... 330/263
6,552,613 B2 * 4/2003 Murray et al. ........... 330/263

* cited by examiner

*Primary Examiner*—Khanh Van Nguyen
(74) *Attorney, Agent, or Firm*—Darby & Darby PC; Matthew M. Gaffney (57) ABSTRACT

A buffer circuit is arranged for offset cancellation between an input voltage and a buffered voltage. The buffer circuit includes two bias current sources, two p-type transistors, and two n-type transistors. Further, the base-emitter voltages of the two p-type transistors and the two n-type transistors are arranged to form a translinear loop. The translinear loop is arranged to provide the buffered voltage from the input voltage. One of the bias sources is arranged to provide a bias current to one of the p-type transistors, and the other bias circuit is arranged to provide a bias current to one of the n-type transistors. One of the bias current circuits is arranged to actively sense the reverse saturation currents of the p-type transistors and the n-type transistors, and to provide its bias current so that the offset voltage between the input voltage and the buffered voltage is substantially cancelled.

25 Claims, 8 Drawing Sheets

APPARATUS AND METHOD FOR CORRECTION OF ERROR CAUSED BY REVERSE SATURATION CURRENT MISMATCH

FIELD OF THE INVENTION

The invention is related to offset cancellation, and in particular, to an apparatus and method of voltage offset cancellation for a four-diode double buffer.

BACKGROUND OF THE INVENTION

Traditional operational amplifiers use voltage feedback. However, a current-feedback amplifier (CFB) typically has significant bandwidth and slew rate advantages over conventional amplifiers.

With a voltage feedback amplifier (VFA) in a closed loop, the error signal is a voltage. A VFA ideally has high impedance inputs, to achieve substantially zero input current, and employs voltage feedback to maintain approximately zero differential input voltage.

In a CFB in a closed loop, the error signal is a current. A CFB ideally has one high impedance input and one low impedance input. Typically, a buffer is used to force the low impedance input to have a voltage equal to the input voltage at the high impedance input plus a voltage offset. A CFB in a closed loop employs current feedback to maintain low error current at the low impedance input.

BRIEF DESCRIPTION OF THE DRAWINGS

Non-limiting and non-exhaustive embodiments of the present invention are described with reference to the following drawings, in which.

DETAILED DESCRIPTION

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal. Where either a field effect transistor (FET) or a bipolar junction transistor (BJT) may be employed as an embodiment of a transistor, the scope of the words "base", "collector", and "emitter" includes "gate", "drain", and "source", respectively.

Briefly stated, the invention is related to a buffer circuit that is arranged for offset cancellation between an input voltage and a buffered voltage. The buffer circuit may include two bias current sources, two p-type transistors, and two n-type transistors. Further, the base-emitter voltages of the two p-type transistors and the two n-type transistors are arranged to form a translinear loop. The translinear loop is arranged to provide the buffered voltage from the input voltage. One of the bias circuits is arranged to provide a bias current to one of the p-type transistors, and the other bias circuit is arranged to provide a bias current to one of the n-type transistors. One of the bias current sources is arranged to actively sense the reverse saturation currents of the p-type transistors and the n-type transistors, and to provide its bias current so that the offset voltage between the input voltage and the buffered voltage is substantially cancelled.

Figure 1:
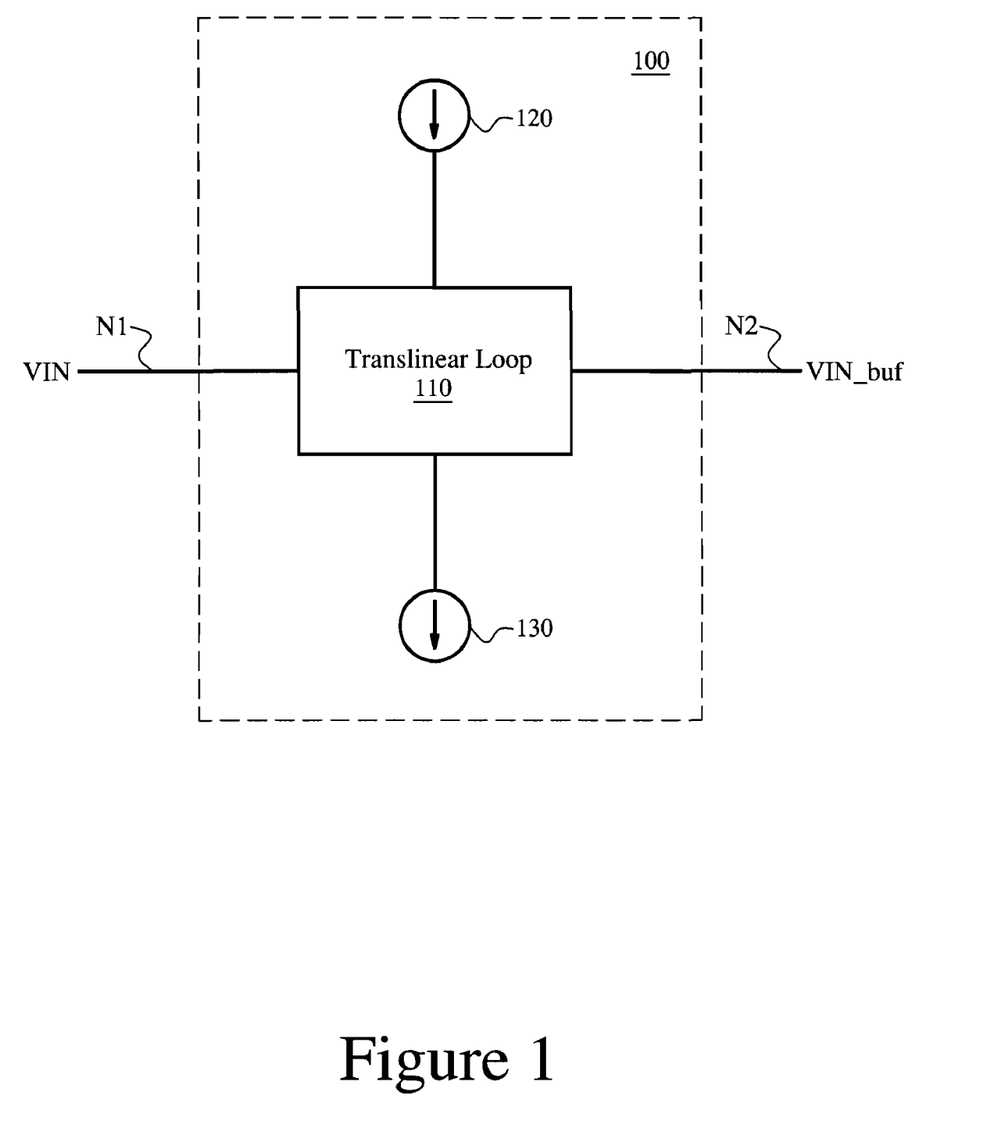
FIG. 1 shows a block diagram of an embodiment of a buffer circuit that is arranged for offset cancellation.

FIG. 1 shows a block diagram of an embodiment of buffer circuit 100, which is arranged for offset cancellation. Buffer circuit 100 includes translinear loop 110, sensing current source circuit 120, and current source 130.

In operation, translinear loop 110 receives input voltage VIN. Further, translinear loop 110 is arranged to cause voltage VIN_buf to have substantially the same voltage as input voltage VIN.

Also, sensing current source 120 and current source 130 are bias current sources. Sensing current source 120 is arranged to provide a bias current to one of the transistors associated with translinear loop 110, and current source 130 is arranged to provide a bias current to another transistor associated with translinear loop 110. One of the bias currents is provided to a p-type transistor, and the other bias current is provided to an n-type transistor.

Sensing bias current source 120 is arranged to actively sense a reverse saturation current associated with the p-type transistor and a reverse saturation current associated with the n-type transistor. Also, sensing current source 120 is arranged to provide its bias current based, in part, on the bias current provided by current 130. Further, sensing current source 120 is arranged to provide its bias current based, in part, on the sensed reverse saturation currents such that an offset voltage between VIN and voltage VIN_buf is substantially cancelled.

In one embodiment, buffer circuit 100 may be employed as a portion of a current-controlled conveyer. In this embodiment, node N1 may be employed as the X input of the current-controlled conveyor, and node N2 may be employed as the Y input of the current controlled conveyor.

In one embodiment, buffer circuit 100 may be employed as a portion of a current-feedback amplifier (CFB). In this embodiment, node N1 may be employed as the non-inverting input of the CFB, and node N2 may be employed as the inverting input of the CFB.

Figure 2:
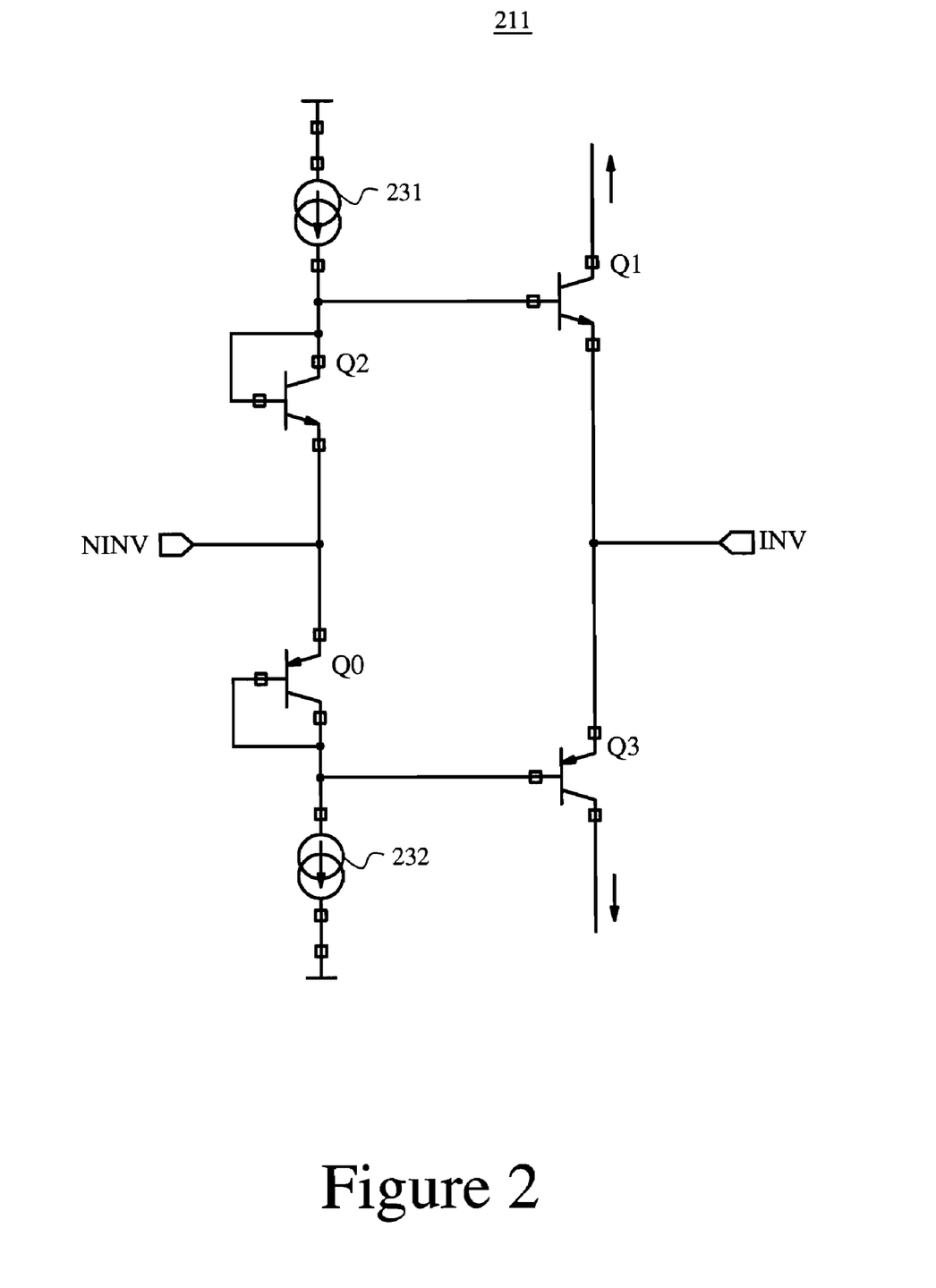
FIG. 2 illustrates a diagram of a four-diode single buffer.

FIG. 2 illustrates a diagram of four-diode single buffer (FDSB) 211. Four-diode single buffer 211 includes transistors Q0–Q3, current source 231, and current source 232.

Transistors Q0 and Q2 are arranged to operate as diodes. Transistor Q0, transistor Q2, the base-emitter junction of transistor Q1, and the base-emitter junction of Q3 are arranged to operate together as a translinear loop. Current source 231 is arranged to provide a bias current to transistor Q2. Current source 232 is arranged to provide another bias current to transistor Q0.

FDSB 211 may be employed as a portion of a CFB having a noninverting input ninv and an inverting input inv. Because transistors Q2 and Q1 are both n-type transistors, and because transistors Q0 and Q3 are both p-type transistors, there is substantially no voltage offset between noninverting input ninv and inverting input inv. However, because transistors Q0 and Q2 are each arranged in a diode configuration, the performance of the CFB may suffer in terms of slew rate, as well as input impedance at the noninverting input.

Figure 3:
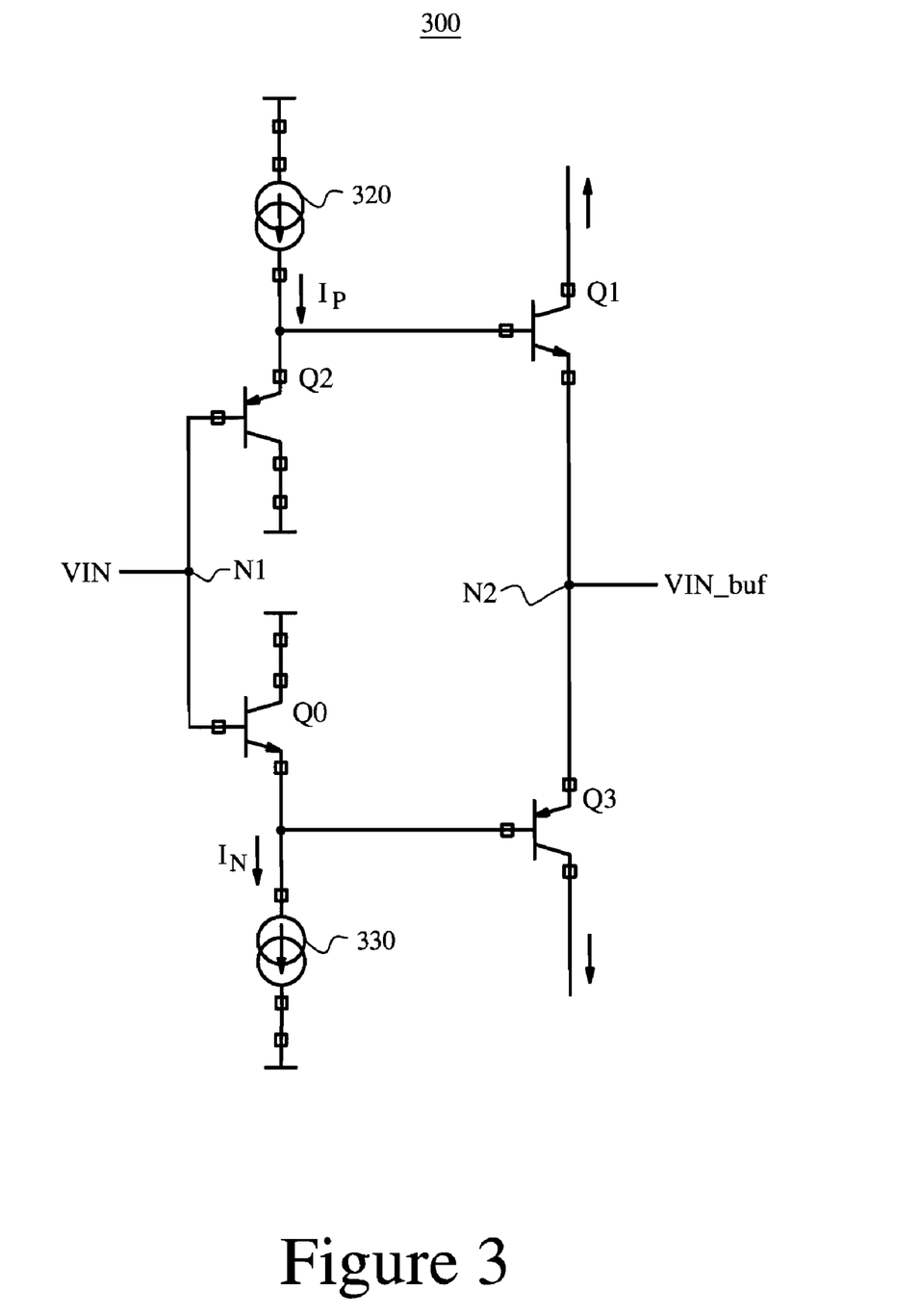
FIG. 3 shows a diagram an embodiment of a four-diode double buffer.

FIG. 3 shows a diagram an embodiment of four-diode double buffer (FDDB) 300. FDDB 300 may be employed as an embodiment of buffer circuit 100 of FIG. 1. FDDB 300 includes transistors Q0–Q3, sensing current source 320, and current source 330.

The base-emitter junctions of transistors Q0–Q3 are arranged to operate together as a translinear loop. Each of the transistors Q0–Q3 is arranged to operate as an emitter follower. There are two paths from node N1 to node N2, each path including a p-type emitter follower followed by an n-type emitter follower.

Node N1 is a high impedance input, and node N2 is a low-impedance input. The offset voltage between voltage VIN and voltage VIN_buf is substantially given by:

$$Vos = V_{BEP3} - V_{BEN0} = V_{BEP2} - V_{BEN1},$$

where Vos represents the offset voltage, and where $V_{BEN0}$, $V_{BEN1}$, $V_{BEP2}$, and $V_{BEP3}$ represent the base-emitter voltages of transistors Q0–Q3 respectively.

Further, the base-emitter voltages are based the reverse saturation currents and the bias voltages, as substantially given by:

$$Vos = (kT/q) * \ln([I_N * I_{SP}]/[I_P * I_{SN}]),$$

where k represents Boltzmann's constant, T represents absolute temperature, q represents the charge of an electron, $I_N$ represents the current provided by current source 330, $I_{SP}$ represents the reverse saturation current associated with p-type transistors Q2 and Q3, $I_P$ represents the current provided by sensing current source 330, and where $I_{SN}$ represents the reverse saturation current associated with n-type transistors Q0 and Q1.

To achieve Vos=0:

$$(kT/q) * \ln([I_N * I_{SP}]/[I_P * I_{SN}]) = 0$$

$$\ln([I_N * I_{SP}]/[I_P * I_{SN}]) = 0$$

$$[I_N * I_{SP}]/[I_P * I_{SN}] = 1$$

$$[I_N * I_{SP}] = [I_P * I_{SN}]$$

$$I_P = I_N * (1 + [I_{SP} - I_{SN}]/I_{SN})$$

$$I_P = I_N * (1 + \eta), \text{ where } \eta = [I_{SP} - I_{SN}]/I_{SN}$$

The quantity η changes over process and temperature, making η essentially a random quantity. In one embodiment, sensing current source 320 is arranged to actively sense the quantity η and to provide current $I_P$ such that $I_P = I_N * (1 + \eta)$. This way, offset current Vos is substantially zero.

Although a particular embodiment of a buffer circuit is illustrated in FIG. 3, many other embodiments are within the scope and spirit of the invention. For example, although bipolar junction transistors (BJTs) are illustrated in FIG. 3, in other embodiments, one or more of the transistors shown in FIG. 3 may be replaced with another type of transistor, such as a field effect transistor (FET), heterojunction bipolar transistor (HBT), or the like. Additionally, although a four-diode double buffer is illustrated in FIG. 3, in other embodiment, a translinear loop with a number of transistors other than four may be employed, and the like.

Also, in FIG. 3, sensing current source 320 is employed to active sense η and to provide a bias current to a p-type transistor based on η. In another embodiment, a sensing current source is employed to provide a bias current to an n-type transistor (e.g. transistor Q0) rather than the p-type transistor.

Figure 4:
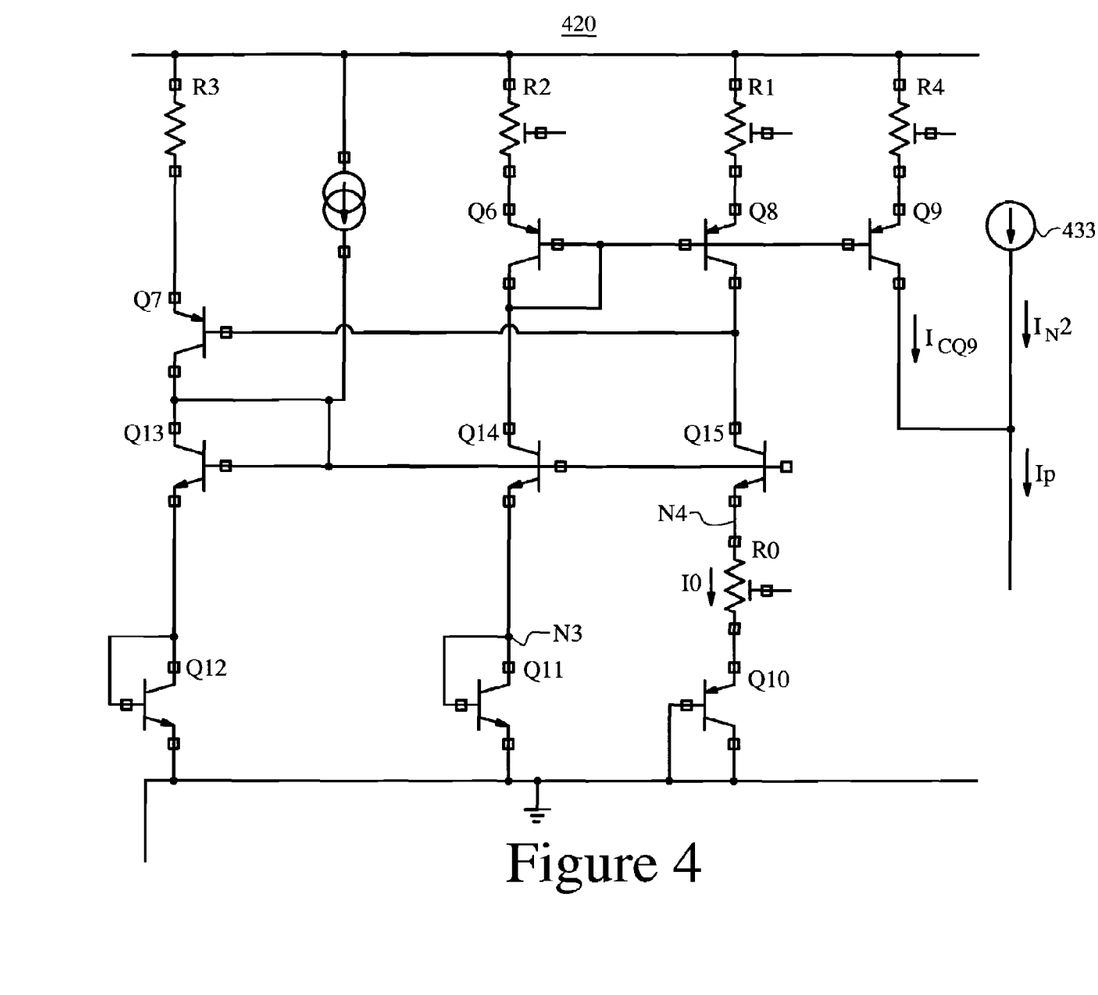
FIG. 4 schematically illustrates an embodiment of the sensing current source of FIG. 3.

FIG. 4 schematically illustrates an embodiment of sensing current source 420, which may be employed as an embodiment of sensing current source 330 of FIG. 3. Sensing current source 420 includes transistors Q6–Q15, resistors R1–R4, and current source 433.

Current source 433 is arranged to provide current $I_N2$ such that current $I_N2$ is substantially equal to bias current $I_N$. Also, sensing current source 420 is arranged such that currents $I_N2$ and $I_{CQ9}$ are combined to provide bias current $I_P$.

Resistor R0 operates as part of a $\Delta V_{BE}$ measurement circuit in sensing current source 420. In one embodiment, resistor R0 is arranged to measure the ΔVBE between the base-emitter voltage of transistor Q10 and the base-emitter voltage of transistor Q11, as follows. The buffer circuit (e.g. buffer circuit 300 of FIG. 3) is configured such that the quiescent bias current for transistors Q10, Q11, and Q13 are the same order of magnitude as the current in transistors Q0 and Q2 of buffer circuit 300, so that they see a similar ambient. Transistors Q6 and Q8 are arranged in a current mirror relationship such that the collector current of transistor Q6 and the collector current of transistor Q8 are substantially equal. Also, transistors Q14 and Q15 are configured with substantially equal transconductances, and have their bases coupled together, so that the voltages at nodes N3 and N4 are substantially equal. Accordingly, $$\Delta V_{BE} = V_{BE11} - V_{BE10} = I0 * R0,$$

where I0 is the current through resistor R0, $V_{BE11}$ is the base-emitter voltage of n-type transistor Q11, and where $V_{BE10}$ is the base-emitter voltage of p-type transistor Q10. Accordingly, current I0 is substantially given by:

$$I0 = (V_T/R0) * \ln(I_{SP}/I_{SN}) = (V_T/R0) * \ln(1 + \eta),$$

where $V_T$ is the thermal voltage, or kT/q. The series expansion of the natural logarithm is given by:

$$\ln(1+x) = x - x^2/2! + x^3/3! + \ldots$$

Using the first term of the expansion, current I0 is substantially given by:

$$I0 = (V_T/R0) * \eta.$$

Sampling transistor Q9 is arranged to sample current I0 such that current $I_{CQ9}$ is substantially given by K*I0, where K is a constant. In one embodiment, the ratio of the resistance of resistor R4 to the resistance of resistor R1 is 1:K.

Further, K is pre-selected in the design of sensing current source 420 such that offset voltage Vos is substantially zero. For the embodiment shown in FIG. 4, bias current $I_P$ is substantially given by:

$$I_P = I_N + K*I0$$

Accordingly, to achieve an offset of substantially zero, K is pre-selected such that:

$$I_N + K*I0 = I_N*(1+\eta).$$

Accordingly, $$I_N + (K*V_T/R0*\eta) = I_N + (I_N*\eta)$$

$$(K*V_T)/R0 = I_N$$

$$K = (I_N*R0)/V_T.$$

Accordingly, in one embodiment, K is pre-selected as $(I_N*R0)/V_T$ during design so that Vos is substantially zero. In one embodiment, current source 330 and resistor R0 are configured so that $I_N*R0$ is substantially proportional to absolute temperature. This way, K is substantially constant. For example, in one embodiment, current source 330 is configured to provide current $I_N$ such that current $I_N$ is substantially proportional to absolute temperature, and resistor R0 is configured such that the resistance of resistor R0 is substantially independent of temperature. In another embodiment, current source 330 is configured to provide current $I_N$ such that current $I_N$ is substantially independent of temperature, and resistor R0 is configured such that the resistance of resistor R0 is substantially proportional to absolute temperature.

Figure 5:
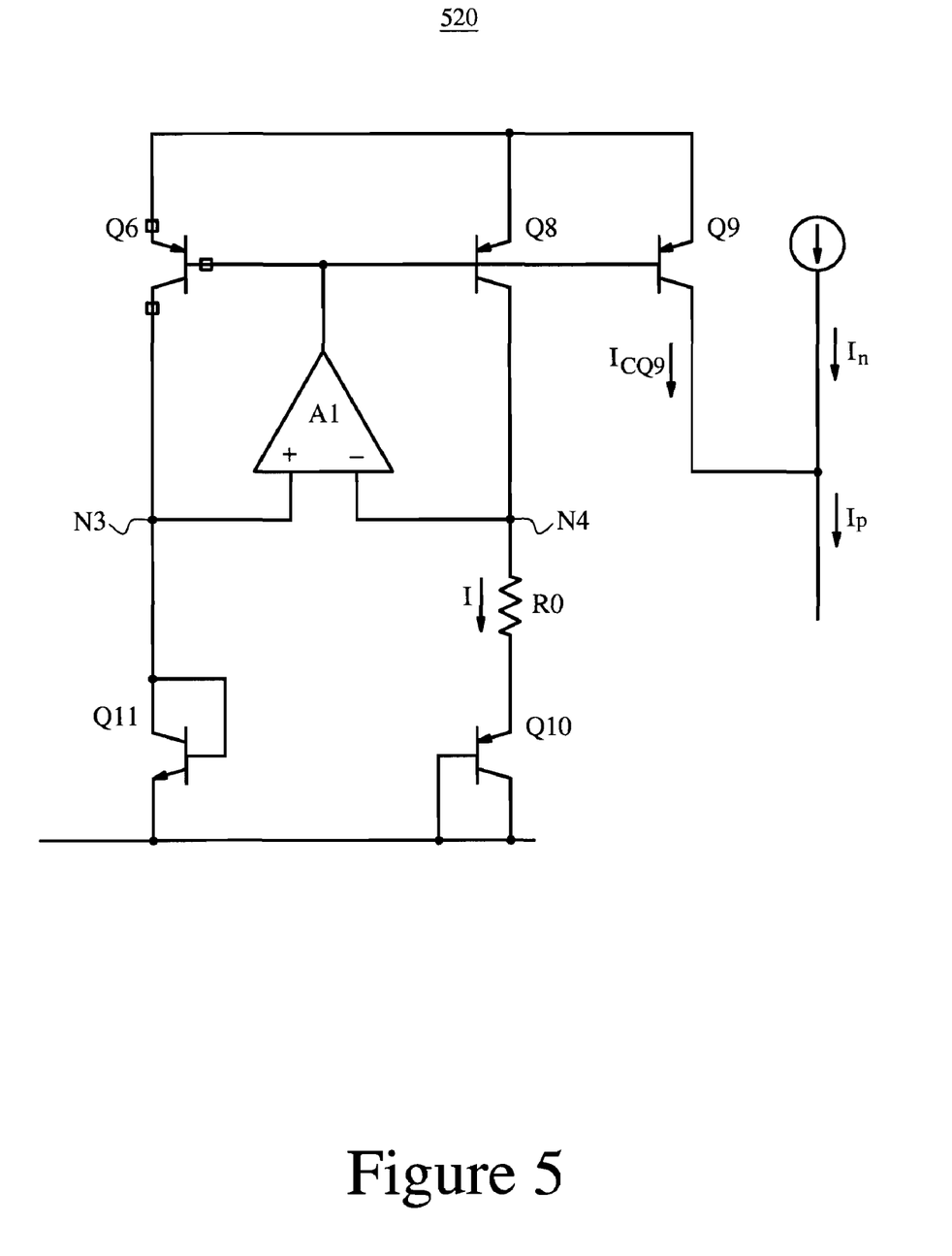
FIG. 5 schematically illustrates another embodiment of the sensing current source of FIG. 3.

FIG. 5 schematically illustrates an embodiment of the sensing current source 530, which may be employed as an embodiment of sensing current source 330 of FIG. 3. Sensing current source 530 is similar to sensing current source 430 of FIG. 3, except that, in sensing current source 530, nodes N3 and N4 are caused to be at substantially equal voltages due to the feedback operation of operational amplifier A1, rather than through the operation of transistors Q14 and Q15 as in FIG. 4.

Although FIG. 4 and FIG. 5 illustrate two embodiments of sensing current source 420, many other embodiments are within the scope and spirit of the invention. For example, although BJTs are shown in FIGS. 4 and 5, in other embodiments, one or more of the transistors shown in FIGS. 4 and 5 may be replaced with a FET, or the like. Also, in FIGS. 4 and 5, resistor R0 is coupled in series with the p-type transistor (Q10). However, for an embodiment employing a process in which Isn is greater than Isp, resistor R0 may be coupled in series with the n-type transistor (Q11) instead of the p-type transistor (Q10). Similarly, in this embodiment, the currents $I_P$ and $I_N$ may be reversed so that sensing current source 320 is arranged to provide current $I_N$ such that current $I_N$ is substantially given by $I_N = I_P*(1+\eta)$.

Figure 6:
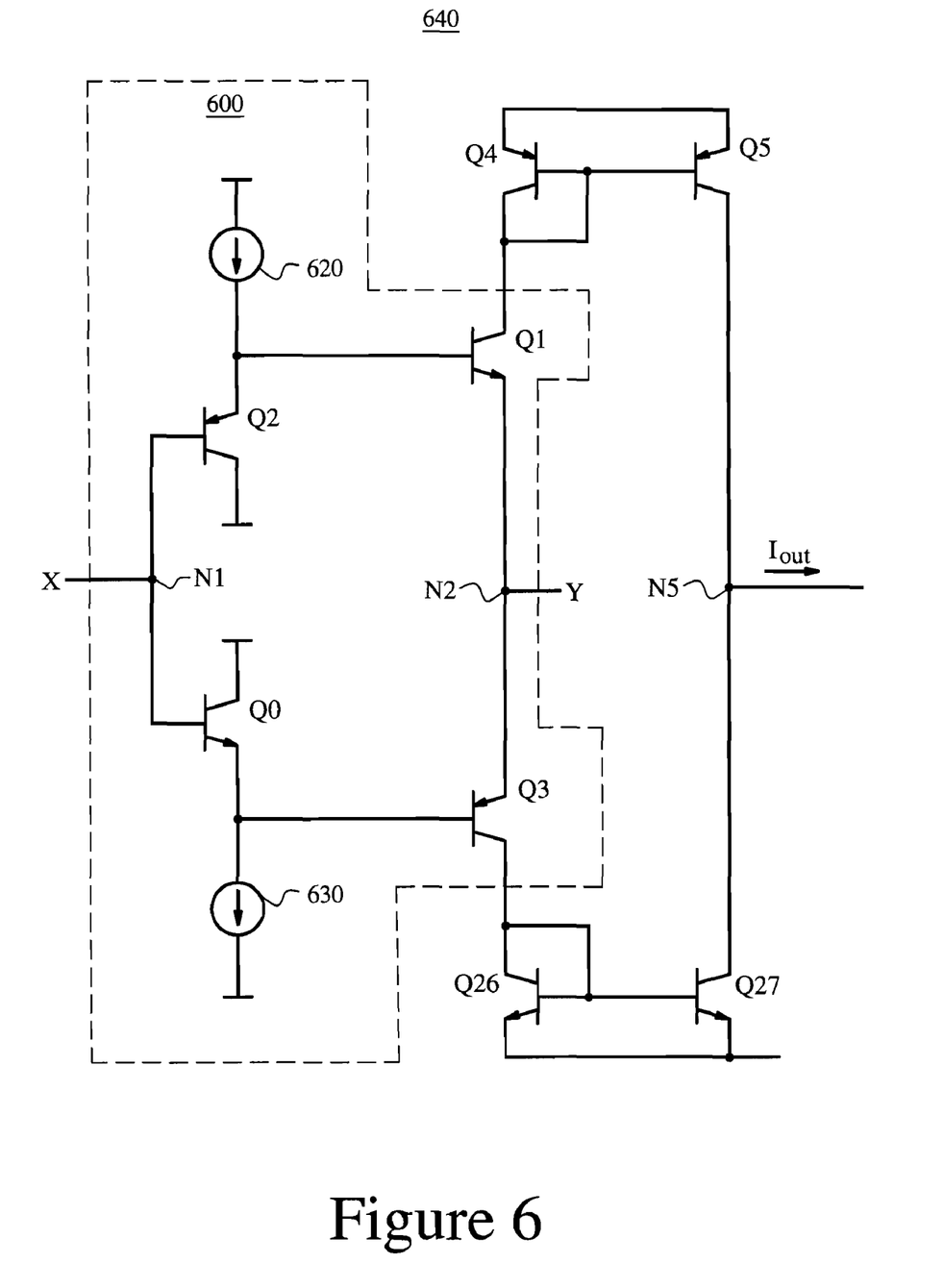
FIG. 6 shows a diagram of an embodiment of a current conveyor that includes the four-diode double buffer circuit of FIG. 3.

FIG. 6 shows a diagram of an embodiment of current conveyor 640, which includes buffer circuit 600. Components in buffer circuit 600 may operate in a substantially similar manner to components in buffer circuit 300 of FIG. 3, and may operate in a different manner in some ways. Current conveyor 640 further includes transistors Q4, Q5, Q26, and Q27.

As previously discussed, buffer circuit 600 is arranged such that the voltage at node N2 is substantially equal to the voltage at node N1, with substantially no voltage offset.

Transistors Q4 and Q5 are arranged to operate as a current mirror, and transistors Q26 and Q27 are arranged to operate as another current mirror. Preferably, the ratio (M) of current mirror Q4/Q5 is substantially the same as the ratio of current mirror Q26/Q27.

Current-controlled conveyor 640 is arranged to receive an input voltage (e.g. input voltage $VI_N$ of FIG. 3) at input X (at high-impedance node N1), and is further arranged to receive an input current at input Y (at low-impedance node N2).

If the current at input Y is substantially zero, the emitter currents of transistors Q1 and Q3 are substantially equal. Accordingly, if the current at input Y is substantially zero, current Iout at node N5 is substantially zero. If the current at input Y is not zero, current Iout is substantially given M*(the current at input Y).

Figure 7:
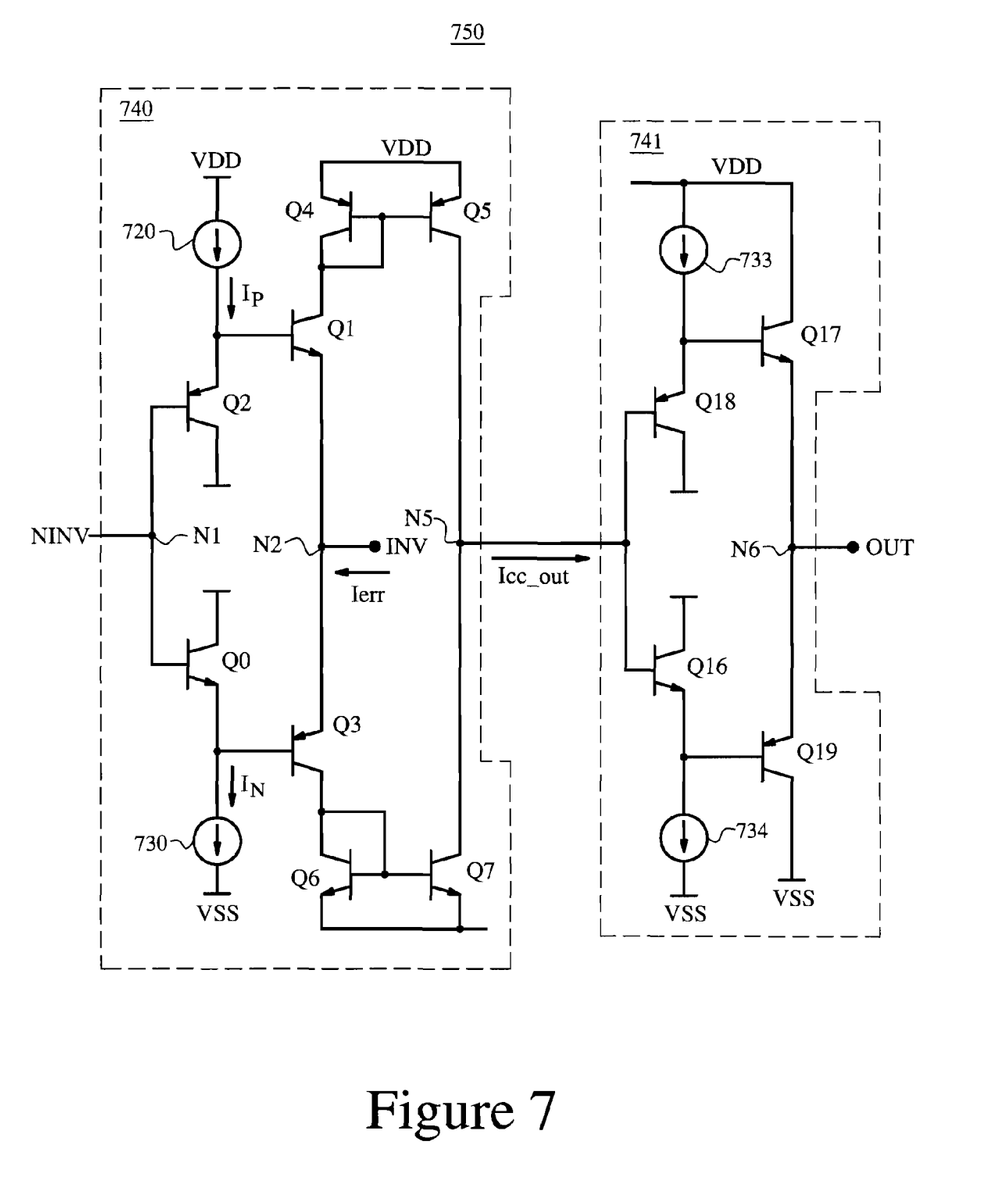
FIG. 7 illustrates a diagram of an embodiment of a CFB that includes the current conveyor of FIG. 6.

FIG. 7 illustrates a diagram of an embodiment of CFB 750, which includes current conveyor 740. In one embodiment, current conveyor 740 is substantially the same as current conveyor 640 of FIG. 6; however, different terminology is employed for the inputs and output. In CFB 750, the input at node N1 is referred to as non-inverting input ninv rather than input X, and the input at node N2 is referred to as inverting input inv rather than input Y. CFB 750 further includes four-diode double buffer 741, which includes transistors Q16–19, current source 733, and current source 734.

FDDB 741 may be substantially similar to the FDDB in current conveyor 740, except that FDDB 741 need not include a current source that senses reverse saturation currents. Rather, in one embodiment, current source 733 is arranged to provide a bias current that is substantially equal to the bias current provided by current source 734.

Current conveyor 740 is arranged to provide conveyor output current Icc_out from error current Ierr. Four-diode double buffer 741 causes node N5 to have a high impedance, Rout. Accordingly, the voltage at node N5 may be substantially given by Icc_out*Rout. Additionally, four-diode double buffer 741 is arranged operate as a voltage buffer to provide voltage out at node N6. The current at node N6 may be substantially given by Ierr*M*$\beta^2$, where $\beta$ is the current gain associated with each transistor Q16, Q17, Q18, and Q19. Further, the open-loop voltage gain (out/$VI_N$) of CFB 750 may be substantially given by gm4*Rout, where gm is the transconductance of transistor Q4.

Figure 8:
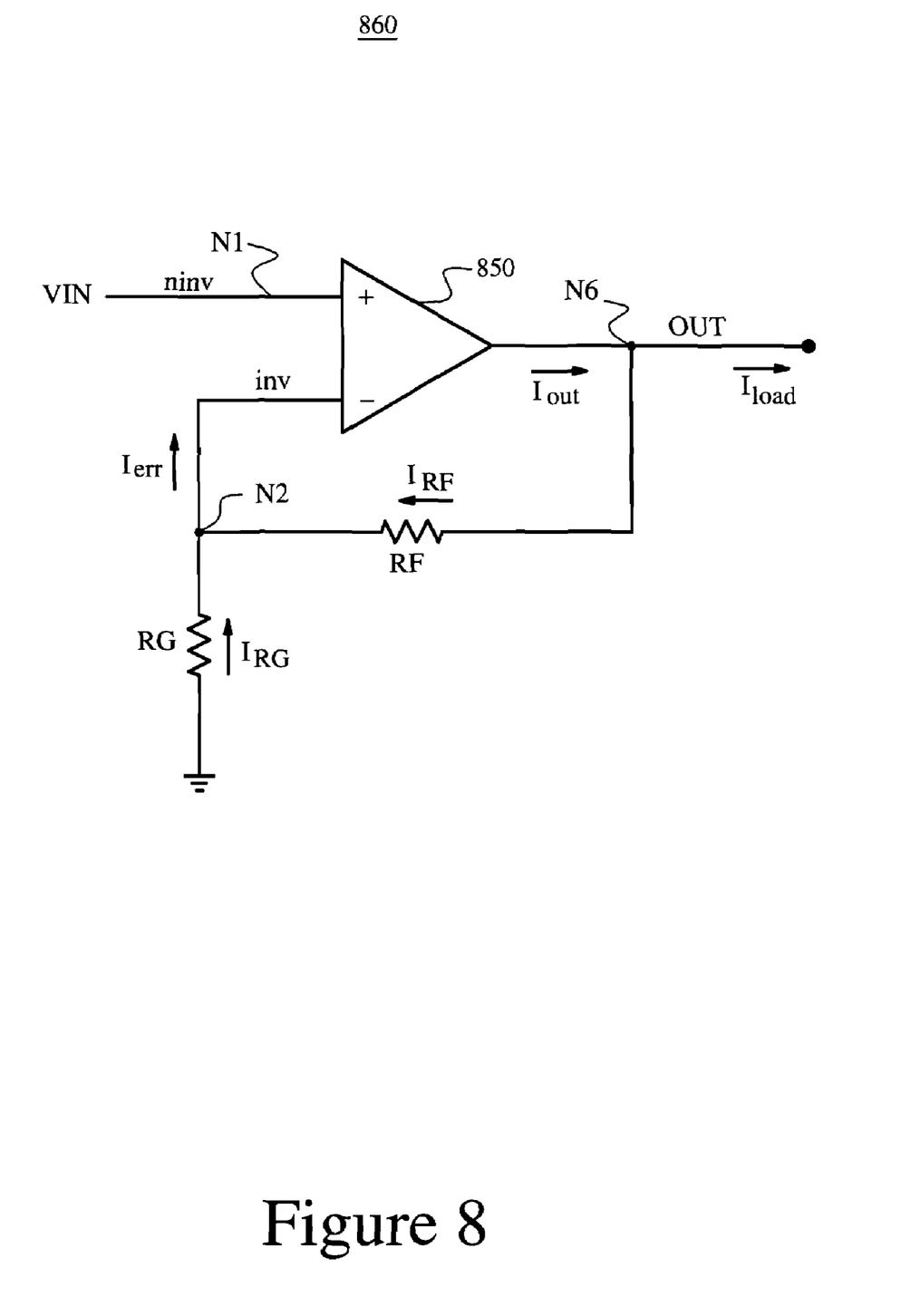
FIG. 8 shows a block diagram of an embodiment of a non-inverting amplifier including the CFB of FIG. 7, arranged in accordance with aspects of the invention.

FIG. 8 shows a block diagram of an embodiment of non-inverting amplifier 860, which includes CFB 850, resistor RG, and resistor RF. CFB 750 of FIG. 7 may be employed as an embodiment of CFB 850.

As previously discussed, the voltage at node N2 is substantially the same as voltage VIN. Accordingly, current $I_{RG}$ is substantially given by VIN/$R_G$. Since the feedback operation of non-inverting amplifier 860 causes error current 860 to become relatively small, voltage out is substantially given by VIN*(1+[$R_F/R_G$]) Accordingly, current $I_{RF}$ is substantially given by VIN/RG+Ierr. Current Iout is substantially given by $I_{RF}$+Iload. Accordingly, current Ierr is substantially given by $$-(I_{RF}+Iload)/(M*\beta^2).$$

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for offset cancellation, comprising:
a first bias current source that is arranged to provide a first bias current; and
a second bias current source, including:
a ΔVBE measurement circuit, including:
a p-type transistor including a base and an emitter;
an n-type transistor including a base and an emitter;
a current mirror circuit that is arranged such that an emitter current of the p-type transistor and an emitter current of the n-type transistor are substantially equal; and
a resistor that is arranged such that a voltage across the resistor is substantially equal to a difference between a base-emitter voltage of the p-type transistor and a base-emitter voltage of the n-type transistor; and
a sampling transistor that is arranged to provide a sampled current such that the sampled current is approximately equal to K*I0, where I0 represents a current associated with the resistor, K is approximately equal to IN*R0/(k*T/q), IN represents the first bias current, R0 represents a resistance of the resistor, k represents Boltzmann's constant, T represents absolute temperature, and where q represents the charge of an electron.

2. The circuit of claim 1, wherein the p-type transistor is a field effect transistor, n-type transistor is another field-effect transistor, the base of the p-type transistor is a gate, the base of the n-type transistor is another gate, the emitter of the p-type transistor is a source, and wherein the emitter of the n-type transistor is another source.

3. The circuit of claim 1, wherein the first bias current source is arranged to provide the first bias current such that the first bias current is substantially proportional to absolute temperature, and wherein the resistance of the resistor is substantially independent of temperature.

4. The circuit of claim 1, wherein the first bias current is arranged to provide the first bias current such that the first bias current is substantially independent of temperature, and wherein the resistance of the resistor is substantially proportional to absolute temperature.

5. The circuit of claim 1, wherein the current mirror circuit includes a current mirror transistor that is arranged to receive the current associated with the resistor, the sampling transistor is arranged in a current mirror relationship with the current mirror transistor, and wherein the current mirror transistor and the sampling transistor have a current mirror ratio of substantially 1:K.

6. The circuit of claim 1, wherein the second bias current source is arranged to provide a second bias current, the second bias current source further includes another current source that is arranged to provide a current that is substantially equal to the first bias current, and wherein the other current source is coupled to the sampling transistor to provide the second bias current such that the second bias current is substantially equal to the sampling current plus the other bias current.

7. The circuit of claim 1, wherein the p-type transistor is arranged in a diode configuration, and wherein the n-type transistor is arranged in a diode configuration.

8. The circuit of claim 1, further comprising:
a fourth transistor including a collector that is coupled to the current mirror circuit, an emitter that is coupled to the n-type transistor, and a gate;
a fifth transistor including a collector that is coupled to the current mirror circuit, an emitter, and a gate that is coupled to the gate of the fourth transistor, wherein the resistor is coupled between the p-type transistor and the emitter of the fifth transistor.

9. The circuit of claim 1, further comprising:
an operational amplifier including a first input that is coupled to the n-type transistor, a second input, and an output that is coupled to the current mirror, wherein the resistor is coupled between the p-type transistor and the second input of the operational amplifier.

10. The circuit of claim 1, wherein the second bias current source is arranged to provide a second bias current based, in part, on the sampled current.

11. The circuit of claim 10, further comprising:
another p-type transistor and another n-type transistor, wherein the first bias current source is arranged to provide the first bias current to one of a group consisting of: the other n-type transistor and the other p-type transistor, and wherein second bias current source is arranged to provide the second bias current to the other of the group consisting of the other n-type transistor and the other p-type transistor.

12. The circuit of claim 11, wherein a base-emitter junction of the other p-type transistor and a base-emitter junction of the other n-type transistor are arranged as at least a portion of a translinear loop.

13. The circuit of claim 10, further comprising:
a four-diode double buffer that is coupled to the first and second bias current sources such that the four-diode double buffer receives the first and second bias currents as bias currents for the four-diode double buffer.

14. The circuit of claim 13, further comprising:
a second current mirror circuit including an input and an output, wherein the four-diode double buffer includes first and second outputs, and wherein the input of the second current mirror is coupled to the first output of the four-diode double buffer;
a third current mirror circuit including an input that is coupled to the second output of the four-diode double buffer, and further including an output that is coupled to the output of the second current mirror circuit.

15. The circuit of claim 14, further comprising another four-diode double buffer that is coupled to the output of the second current mirror circuit.

16. A circuit for offset cancellation, comprising:
a buffer circuit, including:
a p-type transistor including a base and an emitter; and
an n-type transistor including a base and an emitter, wherein the buffer circuit is arranged such that the buffer circuit includes a translinear loop, and such that that a base-emitter voltage of the p-type transistor and a base-emitter voltage of the n-type transistor form at least a portion of the translinear loop, and wherein the translinear loop is arranged to receive an input voltage at an input node, and to provide a buffered voltage at a buffered voltage node;
a first bias current source that is arranged to provide a first bias current to one of the group consisting of: the emitter of the p-type transistor and the emitter of the n-type transistor; and
a second bias current source that is arranged to actively sense a reverse saturation current associated with the p-type transistor and a reverse saturation current associated with the n-type transistor; and further arranged to provide a second bias current to the other of the group consisting of the emitter of the p-type transistor and the emitter of the n-type transistor based, in part, on the first bias current; and further based, in part, on the sensed reverse saturation current such that an offset voltage between the input voltage and the buffered voltage is substantially cancelled.

17. The circuit of claim 16, wherein
the first bias current is arranged to provide the first bias current to the emitter of the first n-type transistor,
the second bias current is arranged to provide the second bias current to the emitter of the first p-type transistor, and
wherein the second bias circuit includes:
a ΔVBE measurement circuit, including:
a p-type transistor including a base and an emitter;
an n-type transistor including a base and an emitter;
a current mirror circuit that is arranged such that a base-emitter current of the p-type transistor and a base-emitter current of the n-type transistor are substantially equal; and
a resistor that is coupled between a resistor node and the emitter of the p-type transistor, wherein the ΔVBE measurement circuit is arranged such that a voltage at the resistor node and a voltage at the emitter of the n-type resistor are substantially equal; and
a sampling transistor that is arranged to provide a sampled current such that the sampled current is approximately equal to K*I0, where I0 represents a current associated with the resistor, K is approximately equal to IN*R0/(k*T/q), IN represents the first bias current, R0 represents a resistance of the resistor; k represents Boltzmann's constant, T represents the absolute temperature, and where q represents the charge of an electron, wherein the second bias circuit is arranged to provide the second bias current such that the second bias current is substantially equal to IN*(K+1).

18. The circuit of claim 16, wherein the buffer circuit further includes:
a second n-type transistor including a base that is coupled to the first p-type transistor, an emitter, and a collector; and
second p-type transistor including a base that is coupled first n-type transistor, an emitter that is coupled to the emitter of the second n-type transistor, and a collector, wherein the translinear loop consists of the base-emitter junctions of the first p-type transistor, the second p-type transistor, the first n-type transistor, and the second n-type transistor.

19. The circuit of claim 18, further comprising:
a first current mirror circuit including an input and an output, wherein the input of the first current mirror is coupled to the collector of the second n-type transistor; and
a second current mirror circuit including an input that is coupled to the collector of the second p-type transistor, and further including an output that is coupled to the output of the first current mirror circuit.

20. The circuit of claim 16, wherein the second bias current source includes a resistor.

21. The circuit of claim 20, wherein the second bias current source further includes a sampling transistor.

22. The circuit of claim 16, wherein
the second bias current source is arranged to provide the second bias current by:
sensing the reverse saturation current;
providing a sampled current that is based, in part, on the reverse saturation current; and
providing the second bias current by combining the sampled current with the first bias current.

23. The circuit of 22, wherein the second bias current source further includes a resistor and a sampling transistor.

24. The circuit of claim 23, wherein the sampling transistor is arranged to provide a sampled current based on a resistor current through the resistor such that a ratio between the resistor current and the sampled current corresponds to substantially IN*R0/(k*T/q), where IN represents the first bias current, R0 represents a resistance of the resistor; k represents Boltzmann's constant, T represents absolute temperature, and where q represents the charge of an electron.

25. A method for offset cancellation, comprising:
providing a first bias current;
employing a resistor to measure a difference between a base-emitter voltage of a p-type transistor and a base-emitter voltage of an n-type transistor;
providing a sampled current based on a resistor current through the resistor such that a ratio between the resistor current and the sampled current corresponds to substantially IN*R0/(k*T/q), where IN represents the first bias current, R0 represents a resistance of the resistor; k represents Boltzmann's constant, T represents absolute temperature, and where q represents the charge of an electron; and
combining the first bias current with the sampled current to provide a second bias current.

* * * * *

UNITED STATES PATENT AND TRADEMARK OFFICE
CERTIFICATE OF CORRECTION

PATENT NO. : 7,224,227 B1
APPLICATION NO. : 11/035156
DATED : May 29, 2007
INVENTOR(S) : Kumar Page 1 of 1

It is certified that error appears in the above-identified patent and that said Letters Patent is hereby corrected as shown below:

In column 5, line 29, delete "$I_N$is" and insert -- $I_N$ is --, therefor.

In column 5, line 60, delete "$I_N$such" and insert -- $I_N$ such --, therefor.

In column 5, line 60, delete "$I_N$is" and insert -- $I_N$ is --, therefor.

In column 6, line 10, delete "$VI_N$of" and insert -- VIN of --, therefor.

In column 6, line 44, delete "(out/$VI_N$)" and insert -- (out/VIN) --, therefor.

In column 6, line 56, after "$(1+[R_F/R_G])$" insert -- . --.

In column 8, line 50, in Claim 16, before "a base-emitter" delete "that".

In column 10, line 22, in Claim 23, delete "22," and insert -- claim 22, --, therefor.

Signed and Sealed this

Thirty-first Day of July, 2007

JON W. DUDAS
*Director of the United States Patent and Trademark Office*